(12) United States Patent
Jo et al.

(10) Patent No.: US 8,482,355 B2
(45) Date of Patent: Jul. 9, 2013

(54) POWER AMPLIFIER

(75) Inventors: Byeong Hak Jo, Gyunggi-do (KR); Yoo Sam Na, Seoul (KR); Hyeon Seok Hwang, Seoul (KR); Moon Suk Jeong, Gyunggi-do (KR); Gyu Suck Kim, Seoul (KR); Moon Sun Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 19 days.

(21) Appl. No.: 13/223,738

(22) Filed: Sep. 1, 2011

(65) Prior Publication Data

US 2013/0057349 A1 Mar. 7, 2013

(51) Int. Cl.
*H03F 1/22* (2006.01)

(52) U.S. Cl.
USPC .......................................... 330/311

(58) Field of Classification Search
USPC ................................. 330/277, 311
See application file for complete search history.

(56) References Cited

U.S. PATENT DOCUMENTS

| 6,211,659 | B1 | 4/2001 | Singh |
| 7,221,218 | B2 * | 5/2007 | Yang ............................... 330/98 |
| 7,362,183 | B2 * | 4/2008 | Kim et al. ..................... 330/311 |
| 2004/0104777 | A1 | 6/2004 | Murari et al. |
| 2005/0140441 | A1 | 6/2005 | Cohen |

\* cited by examiner

*Primary Examiner* — Steven J Mottola
(74) *Attorney, Agent, or Firm* — McDermott Will & Emery LLC

(57) ABSTRACT

There is provided a complementary metal oxide semiconductor (CMOS) power amplifier including: a load unit connected between an operating voltage supply terminal and an output terminal; an amplifying unit formed as a cascode structure between the load unit and a ground, amplifying a power of an input signal input through an input terminal and outputting the amplified signal through an output terminal; and a threshold voltage control unit varying a threshold voltage of the amplifying unit according to a magnitude of the input signal input through the input terminal.

3 Claims, 5 Drawing Sheets

POWER AMPLIFIER

BACKGROUND OF THE INVENTION

1. Field of the Invention

The present invention relates to a complementary metal oxide semiconductor (CMOS) power amplifier capable of being used in a wireless transmission system, and more particularly, to a CMOS power amplifier capable of improving linearity by varying a threshold voltage of an amplifying transistor according to a magnitude of an input signal to thereby reduce distortion of the signal in a linear power amplifier having a cascode structure.

2. Description of the Related Art

Generally, in accordance with the ongoing development of wireless communications, interest in the integration of a radio transceiver has gradually increased. Particularly, a complementary metal oxide semiconductor integrated chip (CMOS IC) is cheap, as compared to a compound semiconductor. Further, in the case of the CMOS IC, many auxiliary ICs may be integrated. Therefore, a large amount of research into CMOS ICs has been conducted.

Typically, since a power amplifier needs to amplify a large signal without distortion, it requires a high breakdown voltage. Therefore, a compound semiconductor such as a heterojunction bipolar transistor (HBT), or the like, is still in use.

However, due to the development of a CMOS design together with the development of a CMOS process, interest in a CMOS power amplifier has been gradually increasing.

Recently, a power amplifier (PA), developed through the CMOS process, has been divided into a switching PA and a linear PA, according to an application thereof. In the case of an application using the switching PA, since information is only carried on a phase of the signal, linearity need not be considered.

However, in the case of an application such as wideband code division multiple access (WCDMA), or the like, information is carried on an amplitude and a phase, and thus, linearity becomes an important performance index. Therefore, significantly reducing intermodulation distortion (IMD) is required. In addition, in the case of a linear PA, since there is a trade-off relationship between linearity (IMD) and power added efficiency (PAE), IMD is required to be significantly reduced without deteriorating other characteristics.

Meanwhile, as an index showing the linearity of the linear amplifier, a value expressing magnitudes of a wanted signal among output signals and a third harmonic in decibels (dB) is used. Here, the larger a difference, the better.

As an example, the linear power amplifier according to the related art includes a single transistor, such that it may be implemented as a CMOS. In this case, since a breakdown voltage is low, the device is broken at maximum output power.

As another example, in the linear amplifier according to the related art, two transistors may be generally implemented as a cascode structure. Here, two transistors are implemented as a cascode stack, such that an operating voltage VDD is divided and used by two transistors. Therefore, a gate breakdown in power amplifiers using a single transistor according to the related art may be prevented.

In the cascode power amplifier according to the related art as described above, as a signal is input, a gate-source voltage Vgs of a transistor increases from 0. When the gate-source voltage Vgs exceeds a threshold voltage (Vth), a drain current Idrain flows.

However, in the cascode power amplifier according to the related art, in a case in which a large signal is input, when a gate-source voltage Vgs of a specific level or more is applied, the power amplifier moves into a saturation region, such that the drain current Idrain becomes constant and distortion of the signal is generated.

SUMMARY OF THE INVENTION

An aspect of the present invention provides a CMOS power amplifier capable of improving linearity by varying a threshold voltage of an amplifying transistor according to a magnitude of an input signal to reduce distortion of the signal in a linear power amplifier having a cascode structure.

According to an aspect of the present invention, there is provided a complementary metal oxide semiconductor (CMOS) power amplifier including: a load unit connected between a operating voltage supply terminal and an output terminal; an amplifying unit formed as a cascode structure between the load unit and a ground, amplifying a power of an input signal input through an input terminal and outputting the amplified signal through an output terminal; and a threshold voltage control unit varying a threshold voltage of the amplifying unit according to a magnitude of the input signal input through the input terminal.

The amplifying unit may include first and second amplifiers formed as the cascode structure, the first amplifier may be connected between the input terminal and the second amplifier, amplify the input signal input through the input terminal and output the amplified signal to the second amplifier, and the second amplifier may be connected between the first amplifier and the output terminal, amplify the signal input from the first amplifier and output the amplified signal to the output terminal.

The first amplifier may include a first transistor having a gate connected to a supply terminal of a first gate voltage through a first resister while simultaneously being connected to the input terminal through a first capacitor, a source and a body connected to the ground, and a drain connected to the second amplifier.

The second amplifier may include a second transistor having a gate connected to a supply terminal of a second gate voltage through a second resistor, a source connected to the drain of the first transistor, a drain connected to the output terminal, and a body connected to the threshold voltage control unit.

The threshold voltage control unit may include a third transistor having a gate connected to a supply terminal of a third gate voltage through a third resister while simultaneously being connected to the input terminal through a second capacitor, a source and a body connected to the ground, and a drain connected to the body of the second transistor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
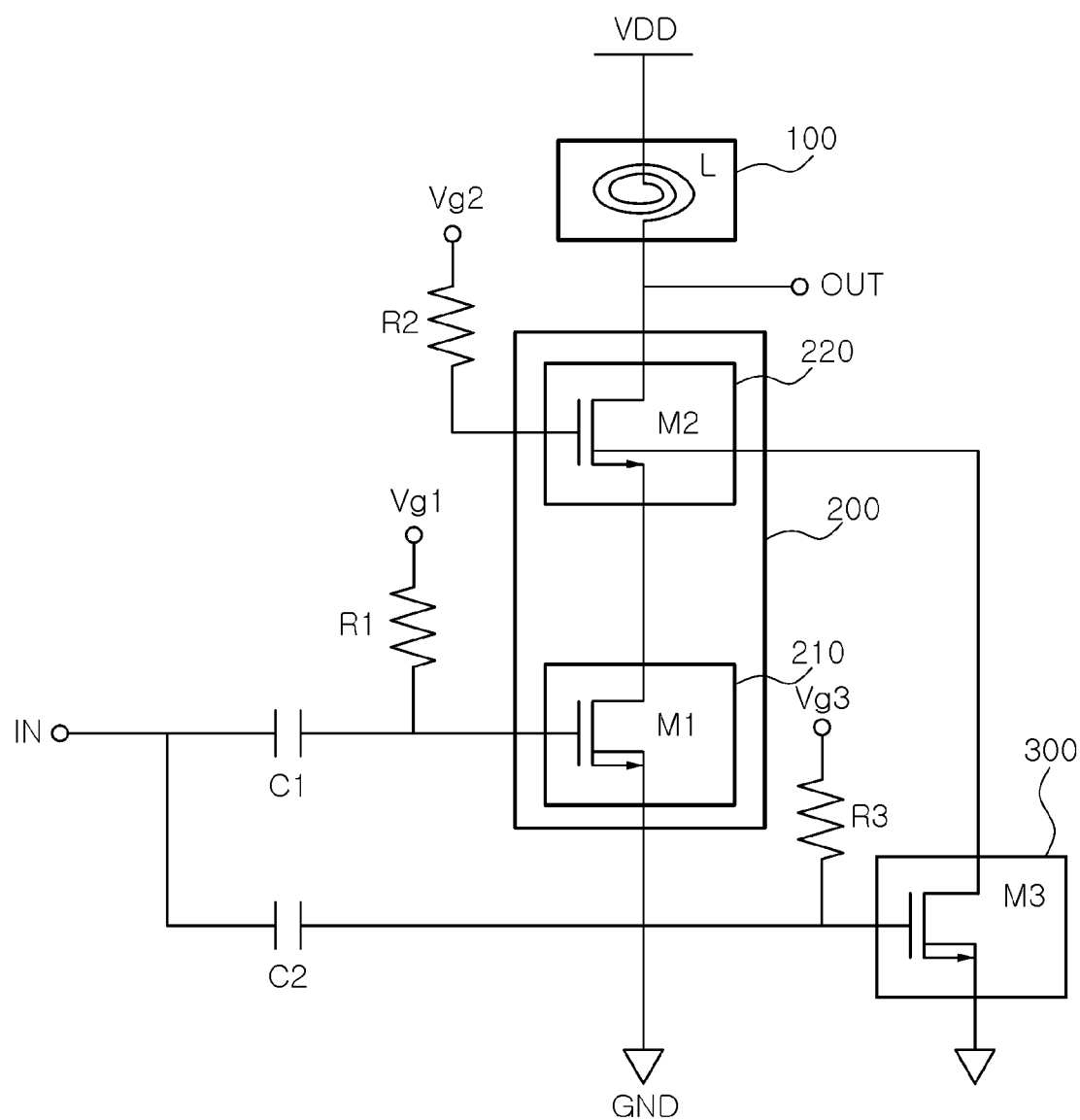
FIG. 1 is a circuit block diagram of a CMOS power amplifier according to an embodiment of the present invention.

Embodiments of the present invention will now be described in detail with reference to the accompanying drawings.

The present invention should not be construed as being limited to the embodiments set forth herein and the embodiments detailed herein may be used to assist in understanding the technical idea of the present invention. Like reference numerals designate like components having substantially the same constitution and function in the drawings of the present invention.

FIG. 1 is a circuit block diagram of a CMOS power amplifier according to an embodiment of the present invention.

Referring to FIG. 1, a CMOS power amplifier according to an embodiment of the present invention may include a load unit 100 connected between a operating voltage supply terminal supplying an operating voltage VDD and an output terminal OUT, an amplifying unit 200 formed as a cascode structure between the load unit 100 and a ground, amplifying a power of an input signal input through an input terminal IN and outputting the amplified signal through an output terminal OUT, and a threshold voltage control unit 300 varying a threshold voltage of the amplifying unit 200 according to a magnitude of the input signal input through the input terminal IN.

The amplifying unit 200 may include first and second amplifiers 210 and 220 formed as the cascode structure, the first amplifier 210 may be connected between the input terminal IN and the second amplifier 220 and amplify the input signal input through the input terminal IN to thereby output the amplified signal to the second amplifier 220, and the second amplifier 220 may be connected between the first amplifier 210 and the output terminal OUT and amplify the signal input from the first amplifier 210 to thereby output the amplified signal to the output terminal OUT.

The first amplifier 210 may include a first transistor M1 having a gate connected to a supply terminal of a first gate voltage Vg1 through a first resister R1 while simultaneously being connected to the input terminal IN through a first capacitor C1, a source and a body connected to a ground, and a drain connected to the second amplifier 220.

In addition, the second amplifier 220 may include a second transistor M2 having a gate connected to a supply terminal of a second gate voltage Vg2 through a second resistor R2, a source connected to the drain of the first transistor M1, a drain connected to the output terminal OUT, and a body connected to the threshold voltage control unit 300.

The threshold voltage control unit 300 may include a third transistor M3 having a gate connected to a supply terminal of a third gate voltage Vg3 through a third resister R3 while simultaneously being connected to the input terminal IN through a second capacitor C2, a source and a body connected to a ground, and a drain connected to the body of the second transistor M2.

Figure 2:
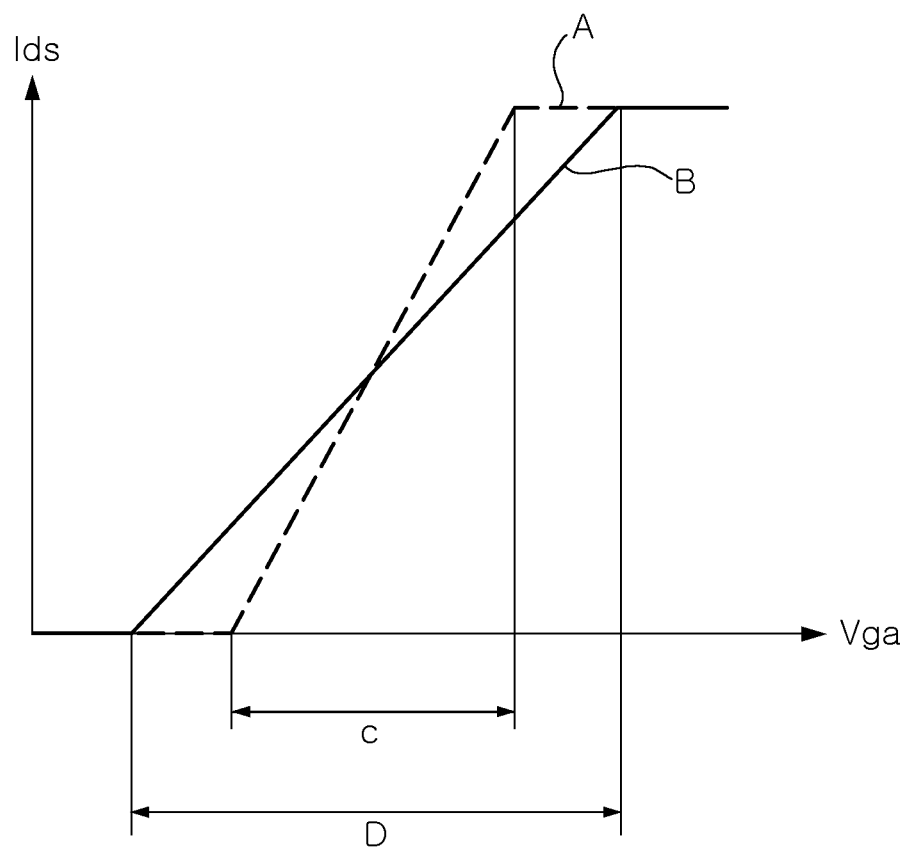
FIG. 2 is a graph showing a linear operation region of a second transistor of a second amplifier according to an embodiment of the present invention.

FIG. 2 is a graph showing a linear operation region of a second transistor of a second amplifier according to an embodiment of the present invention. In FIG. 2, current flowing through the third transistor M3 of the threshold voltage control unit 300 is controlled according to the input signal.

Therefore, a body-source voltage Vbs of the second transistor M2 is varied, such that a linear operation region of the second transistor of the second amplifier according to the embodiment of the present invention may be adjusted (C→D).

Figure 3:
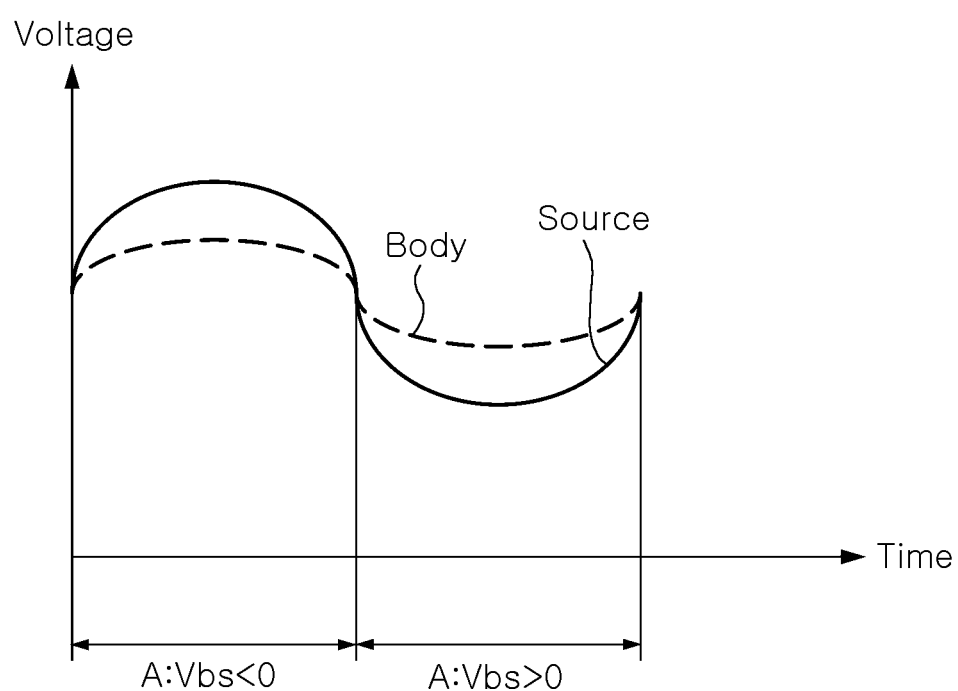
FIG. 3 is a graph showing variation of a threshold voltage through adjustment of a linear operation region of a second transistor of a second amplifier according to an embodiment of the present invention.

FIG. 3 is a graph showing variations of a threshold voltage through an adjustment of a linear operation region of a second transistor of a second amplifier according to an embodiment of the present invention. In FIG. 3, the threshold voltage Vth of the second transistor of the second amplifier is varied according to the magnitude of the input signal. For example, the threshold voltage rises during a period during which the input signal is positive, and falls during a period during which the input signal is negative.

Figure 4:
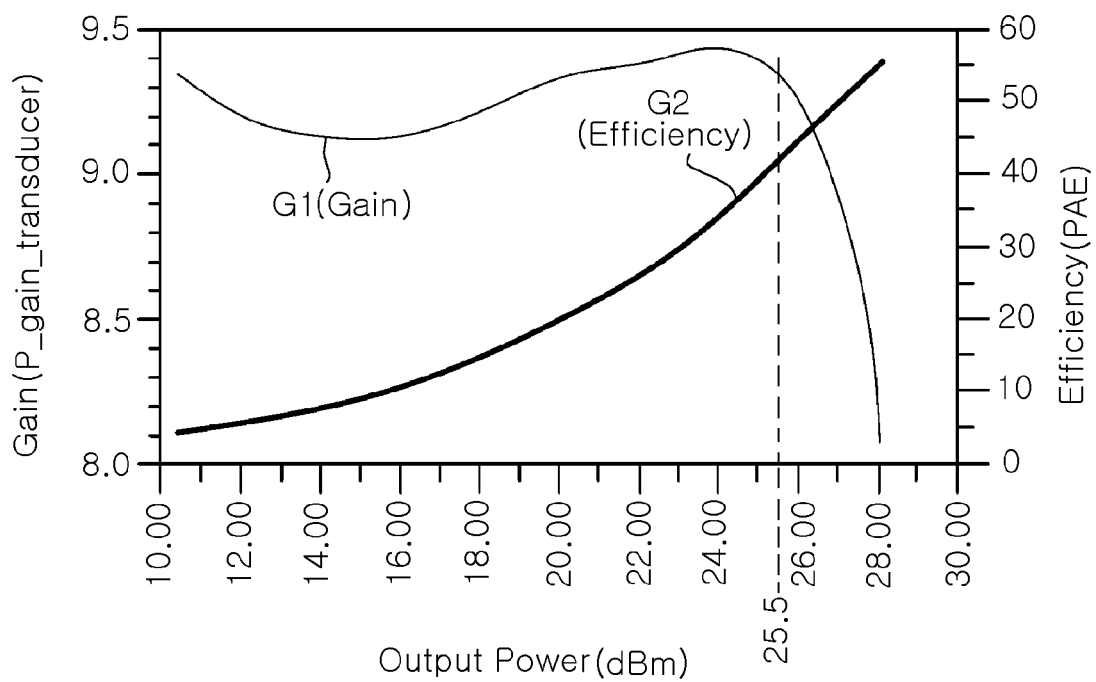
FIG. 4 is a gain and efficiency-output power graph characteristic of a CMOS power amplifier according to an embodiment of the present invention.

FIG. 4 is a gain and efficiency-output power characteristic graph of a CMOS power amplifier according to an embodiment of the present invention.

The gain-output power characteristics graph of the CMOS power amplifier according to the embodiment of the present invention shown in FIG. 4 shows a gain of 9.35 dB and an efficiency of 46% at an output power of 25.5 dBm.

Figure 5:
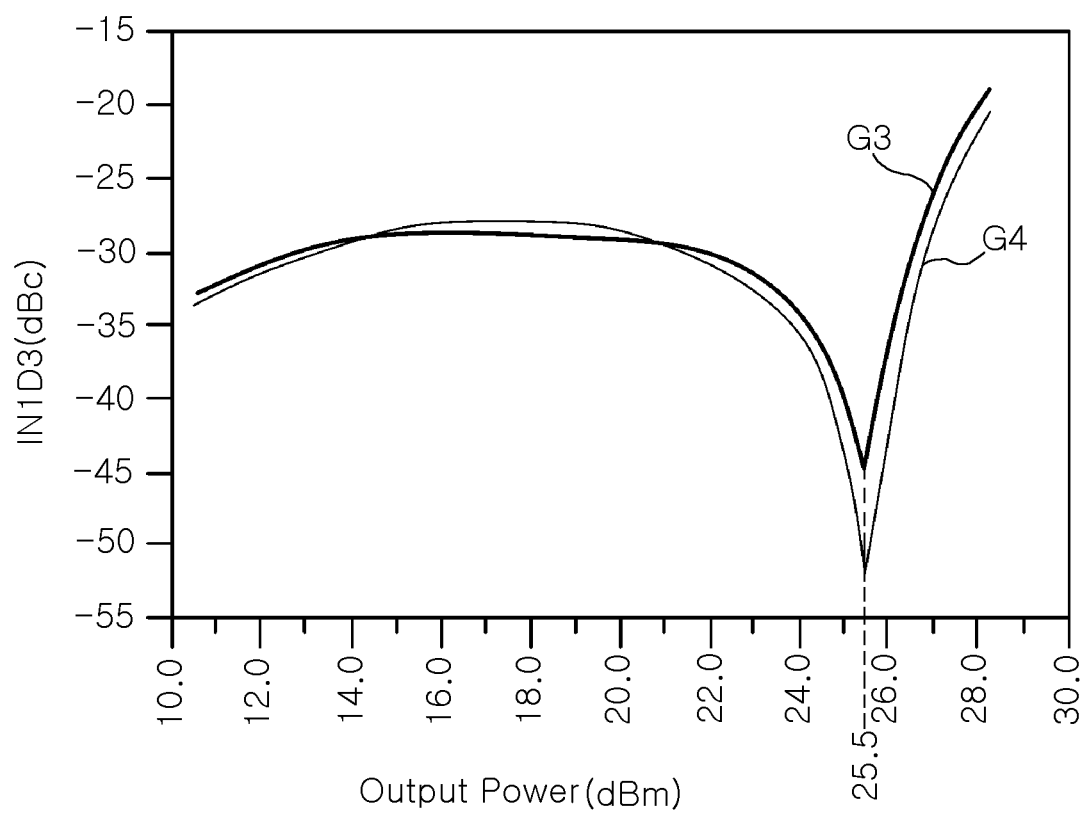
FIG. 5 is an IMD3-output power characteristic graph of a CMOS power amplifier according to an embodiment of the present invention.

FIG. 5 is an IMD3-output power characteristic graph of a CMOS power amplifier according to an embodiment of the present invention.

The IMD-3 output power characteristic graph of the CMOS power amplifier according to the embodiment of the present invention shown in FIG. 5 shows about −44 dBc and −52 dBc at an output power of 25.5 dBm.

Hereinafter, the operations and effects according to an embodiment of the present invention will be described in detail with reference to the accompanying drawings.

The CMOS power amplifier according to the embodiment of the present invention will be described with reference to FIGS. 1 through 5. First referring to FIG. 1, the CMOS power amplifier according to the embodiment of the present invention may include the load unit 100, the amplifying unit 200, and the threshold voltage control unit 300.

Here, the load unit 100 may be connected between the operating voltage supply terminal supplying the operating voltage VDD and the output terminal OUT and may supply the operating voltage VDD to the amplifying unit 200.

The amplifying unit 200 may be formed as the cascode structure between the load unit 100 and the ground, amplifying the power of the input signal input through the input terminal IN and outputting the amplified signal through the output terminal OUT.

Here, the threshold voltage control unit 300 according to the embodiment of the present invention may vary the threshold voltage of the amplifying unit 200 according to the magnitude of the input signal input through the input terminal IN.

The amplifying unit 200 may include the first and second amplifiers 210 and 220 formed as the cascode structure. Here, the first amplifier includes the first transistor M1, and the first transistor M1 is biased by the first gate voltage Vg1, amplifies the input signal input through the input terminal IN and outputs the amplified signal to the second amplifier 220.

In addition, the second amplifier 220 may include the second transistor M2, the second transistor M2 is biased by the second gate voltage Vg2, amplifies the signal input from the first amplifier 210 and outputs the amplified signal to the output terminal OUT.

Meanwhile, the threshold voltage control unit 300 may include the third transistor M3, the third transistor M3 is biased by the third gate voltage Vg3, and a current flowing to the ground through the third transistor M3 is controlled according to the magnitude of the input signal input through the input terminal IN.

Therefore, the body-source voltage Vbs of the second transistor M2 is varied, such that the threshold voltage Vth of the second transistor M2 is varied.

Here, a relationship between the threshold voltage Vth and the body-source of the second transistor M2 is given by the following Equation 1.

$$Vth \propto (1 - Vbs)$$ [Equation 1]

As shown in Equation 1, the threshold voltage control unit 300 according to the embodiment of the present invention may control the threshold voltage Vth of the second transistor M2 of the amplifying unit 200, according to the magnitude of the input signal. Therefore, even in the case in which a large signal is input, the threshold voltage control unit 300 may reduce distortion of the signal.

Describing an operation of the threshold voltage control unit 300 in more detail, when a magnitude of the input signal increases, the current flowing through the third transistor M3 increases to increase the body-source voltage of the second transistor M2 of the amplifying unit 200, such that the threshold voltage increases. When the threshold voltage increases, a sufficient drain current may flow. Therefore, even though the large input signal is input, the distortion of the signal may be reduced.

FIG. 2 is a graph showing a linear operation region of a second transistor M2 of a second amplifier 220 according to an embodiment of the present invention. Referring to the graph shown in FIG. 2, it may be appreciated that the current flowing through the third transistor M3 of the threshold voltage control unit 300 is controlled according to the input signal to vary the body-source voltage Vbs of the second transistor M2, such that the linear operation region of the second transistor M2 of the second amplifier 220 according to the embodiment of the present invention may be adjusted (C→D).

That is, the linear operation region of the second transistor M2 of the second amplifier 220 indicates a period in which a change amount of the gate-source voltage Vgs is represented by a drain-source current Ids. Therefore, when the body-source voltage of the second transistor M2 of the second amplifier 220 is fixed in FIG. 1, the threshold voltage Vth is fixed as shown in graph A of FIG. 2, such that the linear operation region of the second transistor M2 becomes C.

On the other hand, when a portion of the input signal is injected into the body of the second transistor M2 through the third transistor M3 of the threshold voltage control unit 300 as shown in FIG. 1, the body-source voltage Vbs of the second transistor M2 is varied according to a phase of the input signal, such that the threshold voltage Vth is varied as represented by Equation 1. Therefore, an operation such as that of graph B is performed, such that the linear operation region is varied to D.

Referring to FIG. 3, FIG. 3 is a graph showing variations of a threshold voltage through adjustment of a linear operation region of a second transistor of a second amplifier according to an embodiment of the present invention. Referring to the graph shown in FIG. 3, the threshold voltage Vth of the second transistor M2 of the second amplifier 220 is varied according to the magnitude of the input signal. For example, the threshold voltage rises during a period during which the input signal is positive, and falls during a period during which the input signal is negative.

That is, since a signal having the same phase as that of a signal of the source of the second transistor M2 of the second amplifier 220 and a magnitude smaller than that of the signal of the source of the second transistor M2 is applied to the body of the second transistor M2, the body-source voltage Vbs of the second transistor M2 is divided into a positive period and a negative period, and magnitudes of the voltage of each period are continuously varied according to a time, as shown in FIG. 3.

For example, when a period A of FIG. 3 starts, a negative value of the body-source Vbs increases, such that the threshold voltage Vth increases. That is, a positive value of a phase of the input signal increases, such that the threshold voltage Vth increases.

On the other hand, when a period B of FIG. 3 starts, a negative value of the body-source Vbs decreases, such that the threshold voltage Vth gradually decreases.

As described above, the threshold voltage Vth is dynamically varied according to the phase of the input signal, such that the linear operation region of the second transistor M2 of the second amplifier 220 may be varied from a relatively narrow C to a relatively wide D, as shown in the graph of FIG. 2.

The gain, efficiency, and IMD3 characteristics of the CMOS power amplifier according to the embodiment of the present invention will be described with reference to FIGS. 4 and 5.

The gain-output power characteristics graph of the CMOS power amplifier according to the embodiment of the present invention shown in FIG. 4 shows a gain of 9.35 dB and an efficiency of 46% at an output power of 25.5 dBm. As a result, it may be appreciated that the CMOS power amplifier according to the embodiment of the present invention may maintain a sufficient gain and efficiency, even with a high output power, as compared to the power amplifier according to the related art.

The IMD3-output power characteristics graph of the CMOS power amplifier according to the embodiment of the present invention shown in FIG. 5 shows about −44 dBc and −52 dBc at an output power of 25.5 dBm. As a result, it may be appreciated that the CMOS power amplifier according to the embodiment of the present invention shows excellent IMD3 characteristics, as compared to the power amplifier according to the related art.

According to the embodiment of the present invention as described above, in the linear power amplifier having the cascode structure, a non-linear component generated in a transistor serving as a common gate amplifier may be reduced. In addition, a portion of the input signal is injected into the body (or bulk) of the cascode transistor to dynamically vary the threshold voltage Vth of the cascode transistor, whereby the distortion of the signal may be reduced.

As set forth above, according to the embodiment of the present invention, in the linear power amplifier having the cascode structure, the threshold voltage of the amplifying transistor is varied according to the magnitude of the input signal to reduce the distortion of the signal, whereby linearity may be improved.

While the present invention has been shown and described in connection with the embodiments, it will be apparent to those skilled in the art that modifications and variations can be made without departing from the spirit and scope of the invention as defined by the appended claims.

What is claimed is:

1. A power amplifier, comprising:
    a load unit connected between an operating voltage supply terminal and an output terminal;
    an amplifying unit having a cascode structure between the load unit and a ground, and configured to amplify a power of an input signal input through an input terminal and output the amplified signal through an output terminal; and a threshold voltage control unit configured to vary a threshold voltage of the amplifying unit according to a magnitude of the input signal input through the input terminal, wherein the amplifying unit includes first and second amplifiers formed as the cascode structure, the first amplifier is connected between the input terminal and the second amplifier, the second amplifier is connected between the first amplifier and the output terminal, the first amplifier includes a first transistor having a gate connected to a supply terminal of a first gate voltage while simultaneously being connected to the input terminal through a first capacitor, a source and a body connected to the ground, and a drain connected to the second amplifier, and the second amplifier includes a second transistor having a gate connected to a supply terminal of a second gate voltage, a source connected to the drain of the first transistor, a drain connected to the output terminal, and a body connected to the threshold voltage control unit.

2. The power amplifier of claim 1, wherein the first amplifier is configured to amplify the input signal input through the input terminal and output the amplified signal to the second amplifier, and the second amplifier is configured to amplify the signal input from the first amplifier and output the amplified signal to the output terminal.

3. The power amplifier of claim 1, wherein the threshold voltage control unit includes a third transistor having a gate connected to a supply terminal of a third gate voltage through a resistor while simultaneously being connected to the input terminal through a second capacitor, a source and a body connected to the ground, and a drain connected to the body of the second transistor.

* * * * *